United States Patent
Chong

(10) Patent No.: US 9,467,133 B2
(45) Date of Patent: Oct. 11, 2016

(54) COMPARATOR APPARATUS AND METHOD

(71) Applicant: Huawei Technologies Co., Ltd., Shenzhen (CN)

(72) Inventor: Euhan Chong, Ottawa (CA)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/634,220

(22) Filed: Feb. 27, 2015

(65) Prior Publication Data

US 2016/0254806 A1   Sep. 1, 2016

(51) Int. Cl.
*G11C 7/00* (2006.01)
*H03K 5/24* (2006.01)

(52) U.S. Cl.
CPC ............ *H03K 5/2481* (2013.01); *H03K 5/249* (2013.01)

(58) Field of Classification Search
None
See application file for complete search history.

(56) References Cited

U.S. PATENT DOCUMENTS

| 7,233,172 B2* | 6/2007 | Kanamori et al. ..... G11C 7/065 327/55 |
| 2013/0176156 A1 | 7/2013 | Danjo |
| 2013/0257483 A1* | 10/2013 | Bulzacchelli .... H03K 3/356139 327/53 |
| 2013/0265817 A1 | 10/2013 | Christian et al. |
| 2014/0132437 A1 | 5/2014 | Danjo |
| 2014/0253359 A1 | 9/2014 | Niwa |
| 2015/0229308 A1* | 8/2015 | Shih ................. H03K 19/01852 327/112 |

FOREIGN PATENT DOCUMENTS

| CN | 103762962 A | 4/2014 |
| CN | 104022758 A | 9/2014 |
| CN | 104052485 A | 9/2014 |
| CN | 104113342 A | 10/2014 |

\* cited by examiner

*Primary Examiner* — Long Nguyen
(74) *Attorney, Agent, or Firm* — Slater Matsil, LLP

(57) ABSTRACT

A comparator comprises a differential input stage comprising a first n-type transistor and a second n-type transistor, an output stage coupled to the differential input stage, a clock transistor coupled to the differential input stage and a pre-charge apparatus connected in parallel with the clock transistor.

20 Claims, 3 Drawing Sheets

COMPARATOR APPARATUS AND METHOD

TECHNICAL FIELD

The present invention relates to a comparator, and, in particular embodiments, to a system and method to increase the speed of a comparator.

BACKGROUND

As communication technologies further advance, serial interfaces have been widely employed in communication protocols such as Ethernet and PCI Express. For example, serial interfaces have been widely used to convert signals between parallel bus-connected devices and high-speed serial communication systems. In order to enable the movement of a large amount of data between parallel and serial systems, a serializer/deserializer is employed to convert data from a parallel data form to a serial data form in the high-speed serial communication systems.

The serial communication system in its simplest form may comprise a transmitter, a communication channel and a receiver. The transmitter may receive a parallel set of bits and convert them into serial signals through suitable digital circuits such as multiplexers and shift registers. The serial signals are transmitted over the communication channel to the receiver.

The receiver may comprise a clock and data recovery circuit, which is capable of extracting a clock signal from the received serial signals. The recovered clock is used to accurately sample the received data.

The receiver may further comprise a pre-amplifier, a comparator coupled to the output of the pre-amplifier, and a decoder. The pre-amplifier is employed to improve the gain of the received signals and reduce input referred noise. The comparator may contain a suitable amplifier such as a static amplifier or a clocked regenerative amplifier. The decoder is coupled to the output of the comparator. The decoder may be used to achieve advanced modulation.

The clocked regenerative amplifier is also known as a latch comparator. The latch comparator may receive a clock signal and two differential input signals. The latch comparator samples the differential input signals at clock edges (e.g., the clock edge from a logic low state to a logic high state) and generates a binary 0 or 1 at the output of the latch comparator. The latch comparator is widely used in various applications such as memories, analog-to-digital converters (ADC) and high speed serial links.

SUMMARY OF THE INVENTION

In accordance with an embodiment, a comparator comprises a differential input stage comprising a first transistor and a second transistor, the first and second transistors configured to receive a differential input signal, an output stage coupled to the differential input stage, wherein the output stage is configured to amplify the differential input signal, a clock transistor connected between the differential input stage and a supply voltage and a pre-charge apparatus connected in parallel with the clock transistor, wherein the pre-charge apparatus is configured to selectively bias the differential input stage.

In accordance with another embodiment, a system comprises a buffer configured to receive a differential signal and produce a buffered differential signal and a receiver connected to the buffer, the receiver having a latch comparator comprising a differential input stage configured to receive the buffered differential signal, an output stage coupled to the differential input stage, wherein the output stage is configured to amplify the buffered differential signal, a clock transistor connected between the differential input stage and a supply voltage and a pre-charge apparatus connected in parallel with the clock transistor, wherein the pre-charge apparatus is configured to selectively bias the differential input stage.

In accordance with yet another embodiment, a latch comparator comprises a differential input stage comprising a first transistor and a second transistor, the first and second transistors configured to receive a differential input signal, an output stage coupled to the differential input stage, wherein the output stage is configured to amplify the differential input signal, a clock transistor connected between the differential input stage and a supply voltage, wherein a gate of the clock transistor is configured to receive a clock signal and a pre-charge apparatus connected in parallel with the clock transistor, wherein the pre-charge apparatus comprises a plurality of transistors connected in parallel, and wherein at least one transistor is configured to be turned on when the clock signal has a logic low state.

An advantage of an embodiment of the present invention is having a pre-charge apparatus capable of weakly biasing the input stage of a latch comparator. As a result, the latch comparator may respond quickly during a transition from a reset phase to a comparison phase of the latch comparator. Such a quick response helps to improve a variety of performance characteristics such as reduced delay time and low input referred noise.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely a latch comparator in a receiver of a high speed serial link system. The invention may also be applied, however, to a variety of different applications such as memories and analog-to-digital converters (ADC). Hereinafter, various embodiments will be explained in detail with reference to the accompanying drawings.

Figure 1:
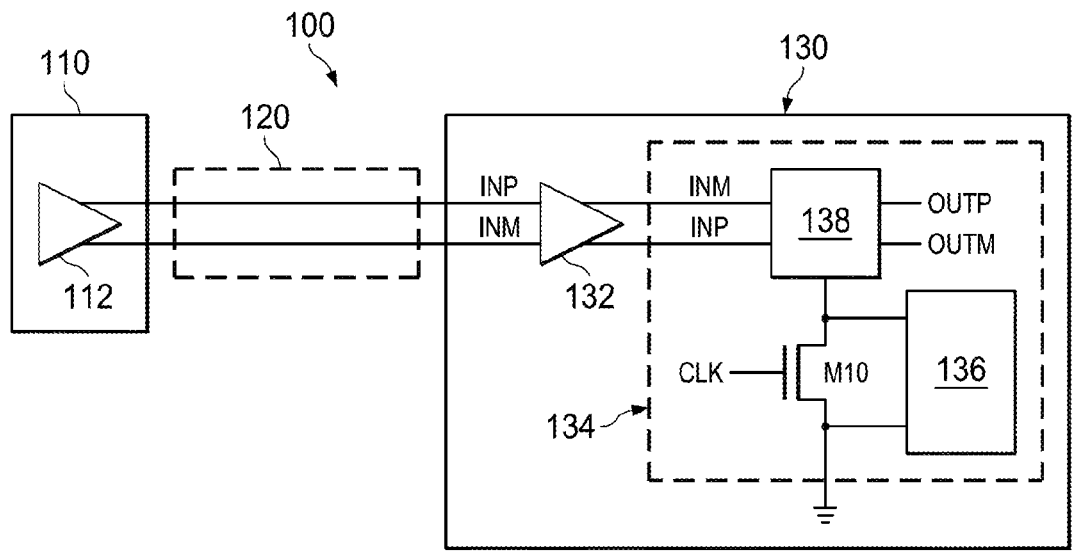
FIG. 1 illustrates a block diagram of a high speed serial link system in accordance with various embodiments of the present disclosure.

FIG. 1 illustrates a block diagram of a high speed serial link system in accordance with various embodiments of the present disclosure. The high speed serial link system 100 comprises a transmitter 110, a differential pair of lines 120 and a receiver 130. As shown in FIG. 1, the transmitter 110, the differential pair of lines 120 and the receiver 130 are connected in cascade.

The transmitter 110 comprises an output buffer 112 as shown in FIG. 1. In some embodiments, the output buffer 112 may be implemented as an inverter or a plurality of inverters. It should be noted that the transmitter 110 is capable of performing a variety of functions such as data serialization. In the present disclosure, only one output buffer 112 is included in the transmitter 110.

The transmitter 110 may generate a first differential signal INP and a second differential signal INM and send both differential signals to the receiver 130. The receiver 130 may be far away from the transmitter 110 in the high speed serial link system 100. In order to have noise-free signals fed into the receiver 130, the differential pair of lines 120 may be employed to carry the first differential signal INP and the second differential signal INM as shown in FIG. 1.

In some embodiments, the differential pair of lines 120 may comprise two complementary transmission lines that transfer opposite signals. In a layout, the differential pair of lines 120 may be implemented as a pair of tightly coupled layout traces. One trace may carry a first differential signal INP. The other may carry the second differential signal INM as shown in FIG. 1. In summary, the differential pair of lines 120 may function as two transmission lines for carrying the differential signals.

The receiver 130 comprises an input buffer 132 and a comparator 134. The input buffer 132 is implemented as an inverter or a plurality of inverters. In an embodiment, the input buffer 132 receives a differential signal sent from the transmitter 110. The input buffer 132 produces a buffered differential signal and sends the buffered differential signal to the comparator 134. In some embodiments, the comparator 134 is implemented as a strong-arm latch comparator. Throughout the description, the comparator 134 may be alternatively referred to as the strong-arm latch comparator 134. The strong-arm latch comparator 134 comprises two portions. A first portion 138 may comprise a plurality of bias circuits, a differential input stage and an output stage. The detailed schematic diagram of the first portion 138 will be described below with respect to FIGS. 2-3. A second portion comprises a clock transistor M10 and a pre-charge apparatus 136.

It should be noted that the receiver 130 is able to perform other functions such as data deserialization, clock recovery and clock synchronization. In the present disclosure, only the input buffer 132 and the comparator 134 are included in the receiver 130 as shown in FIG. 1. As shown in FIG. 1, the first portion 138 of the comparator 134 is coupled to the clock transistor M10. More particularly, the differential input stage 139 (not shown but illustrated in FIG. 2) of the strong-arm latch comparator 134 is coupled to the clock transistor M10. As shown in FIG. 1, the pre-charge apparatus 136 is connected in parallel with the clock transistor M10. In some embodiments, the pre-charge apparatus 136 is a digitally controlled pre-charge apparatus. In particular, when a logic low state of the clock signal is applied to the gate of the clock transistor M10, the clock transistor M10 is turned off accordingly. Through a suitable digital control mechanism, the pre-charge apparatus 136 is not turned off. The pre-charge apparatus 136 is formed by one transistor or more pre-charge transistors. At least one of the pre-charge transistors is turned on to bias the differential input state.

One advantageous feature of having the pre-charge apparatus 136 is that the pre-charge transistors help to improve the speed of the comparator 134. More particularly, since the pre-charge transistors are not fully turned off, the differential input stage of the comparator 134 is weakly biased. As a result, during a transition of the clock signal from a logic low state to a logic high state, the comparator 134 may respond quickly in comparison with a comparator not having the pre-charge apparatus 136. The detailed operation principles of the pre-charge apparatus 136 will be described below with respect to FIGS. 2-3.

Figure 2:
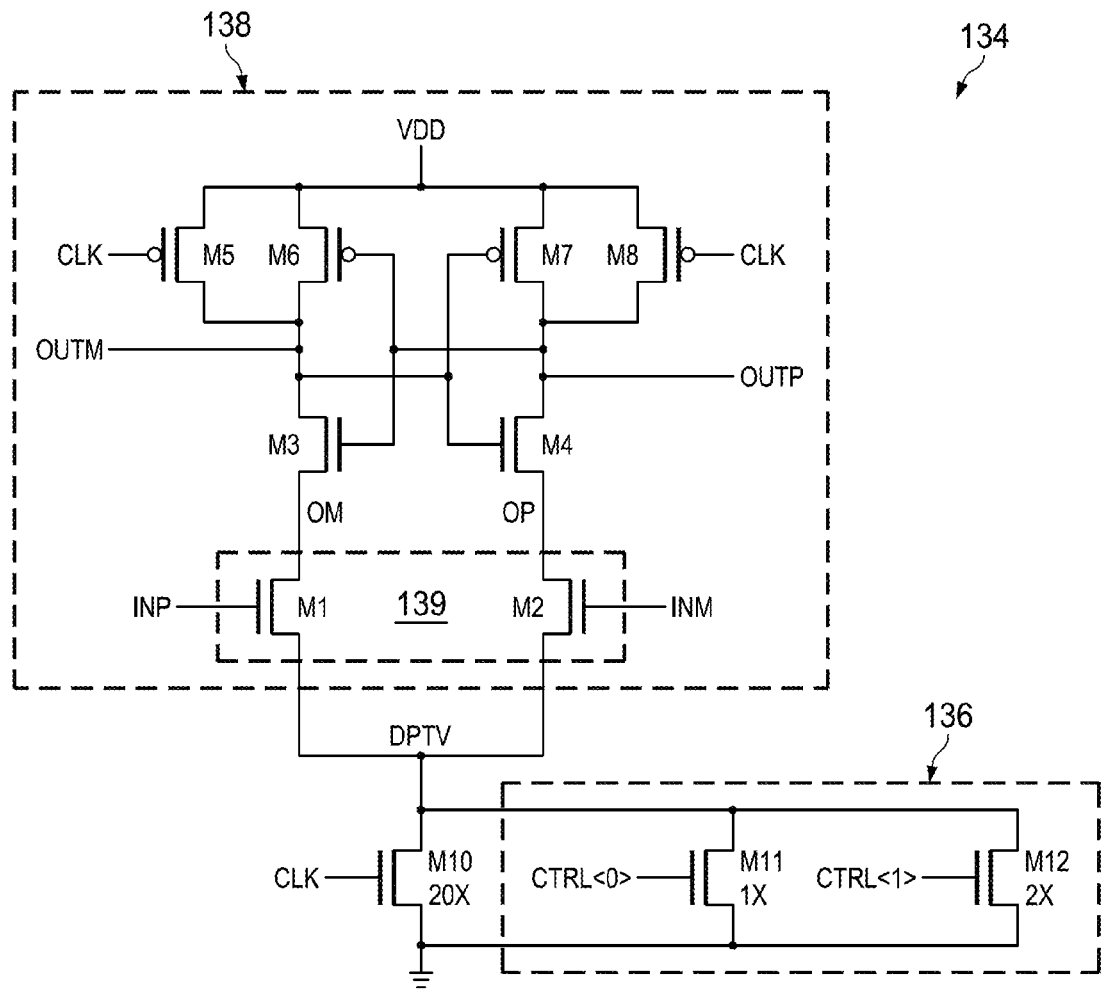
FIG. 2 illustrates a schematic diagram of a first implementation of the comparator shown in FIG. 1 in accordance with various embodiments of the present disclosure.

FIG. 2 illustrates a schematic diagram of a first implementation of the comparator shown in FIG. 1 in accordance with various embodiments of the present disclosure. In some embodiments, the comparator 134 is implemented as a strong-arm latch comparator as shown in FIG. 2. The latch comparator 134 comprises two back-to-back connected inverters formed by transistors M3, M4, M6 and M7, two bias transistors M5 and M8, a differential input stage formed by transistors M1 and M2, a clock transistor M10, and a pre-charge apparatus 136 formed by transistors M11 and M12.

It should be noted that the strong-arm latch comparator shown in FIG. 2 is merely an example, which should not unduly limit the scope of the claims. One of ordinary skill in the art would recognize many variations, alternatives, and modifications. For example, the strong-arm latch comparator can be replaced by any suitable comparator, for example, a differential pair.

As shown in FIG. 2, p-type transistor M6 and n-type transistor M3 form a first inverter. The first inverter is coupled between a voltage potential VDD and a node OM. Likewise, p-type transistor M7 and n-type transistor M4 form a second inverter. The second inverter is coupled between the voltage potential VDD and a node OP. The output signals OUTM and OUTP of the latch comparator 134 are generated at the outputs of the first inverter and the second inverter respectively.

The input of the first inverter is connected to the output of the second inverter. Similarly, the input of the second inverter is connected to the output of the first inverter. In summary, transistors M3, M4, M6 and M7 form two back-to-back connected inverters. These two back-to-back connected inverters form the output stage of the latch comparator 134. The output stage is employed to amplify the signals received by the differential input stage.

P-type transistors M5 and M8 function as bias transistors. As shown in FIG. 2, p-type transistor M5 is connected in parallel with p-type transistor M6. The gate of p-type transistor M5 is connected to the clock signal CLK Likewise, p-type transistor M8 is connected in parallel with p-type transistor M7. The gate of p-type transistor M8 is connected to the clock signal CLK. In some embodiments, when the clock signal CLK has a logic low state, both p-type transistor M5 and p-type transistor M8 are turned on. As a result, the output signals OUTM and OUTP are pulled high to a level approximately equal to VDD.

N-type transistors M1 and M2 form the differential input stage of the latch comparator 134. In some embodiments, the differential input stage is configured to receive a differential input signal. As shown in FIG. 2, the gate of transistor M1 is configured to receive a first input signal INP. The gate of transistor M2 is configured to receive a second input signal INM. In some embodiments, the differential input stage of the latch comparator 134 is employed to reject common mode noise.

The clock transistor M10 is an n-type transistor coupled between a node DPTV and ground. The gate of the clock transistor M10 is coupled to the clock signal CLK. The pre-charge apparatus 136 comprises a plurality of transistors connected in parallel. In some embodiments, the pre-charge apparatus 136 comprises two transistors connected in parallel as shown in FIG. 2.

Both n-type transistor M11 and n-type transistor M12 are coupled between the node DPTV and ground. The gate of n-type transistor M11 is connected to a first bit of a control code. The gate of n-type transistor M12 is connected to a second bit of the control code. In other words, n-type transistor M11 and n-type transistor M12 form a digitally controlled pre-charge apparatus.

In some embodiments, n-type transistors M11 and M12, and the control code applied to M11 and M12 form a binary weighted circuit. A control code is applied to the gates of n-type transistors M11 and M12. More particularly, a first bit CTRL<0> of the control code is applied to the gate of transistor M11. A second bit CTRL<1> of the control code is applied to the gate of transistor M12.

It should be noted that while the diagram shown in FIG. 2 is binary weighted, the actual implementation may be any suitable control mechanisms such as thermometer code.

It should further be noted the on and off of the transistors in the pre-charge apparatus 136 may be determined based upon a semiconductor fabrication process monitor (not shown). Activating the transistors in the pre-charge apparatus may increase the power consumption of the latch comparator 134. In order to find a good balance between the delay time and the power consumption, a semiconductor fabrication process monitor may be employed to detect whether a semiconductor fabrication process is a slow process (SS), a typical process (TT) or a fast process (FF). In a FF process, all transistors in the pre-charge apparatus 136 may be turned off so that the power consumption may be reduced. On the other hand, in a SS process, all transistors in the pre-charge apparatus 136 may be turned on so that the delay time may be reduced.

Furthermore, the performance of a latch comparator may vary greatly over different operating conditions such as process-voltage-temperature (PVT). An operation condition monitor (not shown) may be employed to detect changes in operating conditions. Based upon different operating conditions, the transistors of the pre-charge apparatus 136 may be selectively turned on accordingly. As such, the performance of the latch comparator may be kept more consistent at different operating conditions.

In some embodiments, the clock transistor M10, the first pre-charge charge transistor M11 and the second pre-charge transistor M12 may be formed by a plurality of transistor cells having identical channel widths. In some embodiments, the first pre-charge transistor M11 has 1× transistor cells. The second pre-charge transistor M12 has 2× transistor cells. The clock transistor M10 has 20× transistor cells. In other words, the total number of transistor cells in the clock transistor M10 is twenty times greater than the total number of transistor cells in the first pre-charge transistor M11. That is, a size ratio of the clock transistor M10 to the first pre-charge transistor M11 is 20:1. Likewise, the total number of transistor cells in the clock transistor M10 is ten times greater than the total number of transistor cells in the second pre-charge transistor M12. A size ratio of the clock transistor M10 to the second pre-charge transistor M12 is 10:1. It should be appreciated that any desired number of pre-charge transistors having any suitable ratio of sizes could alternatively be used.

Figure 3:
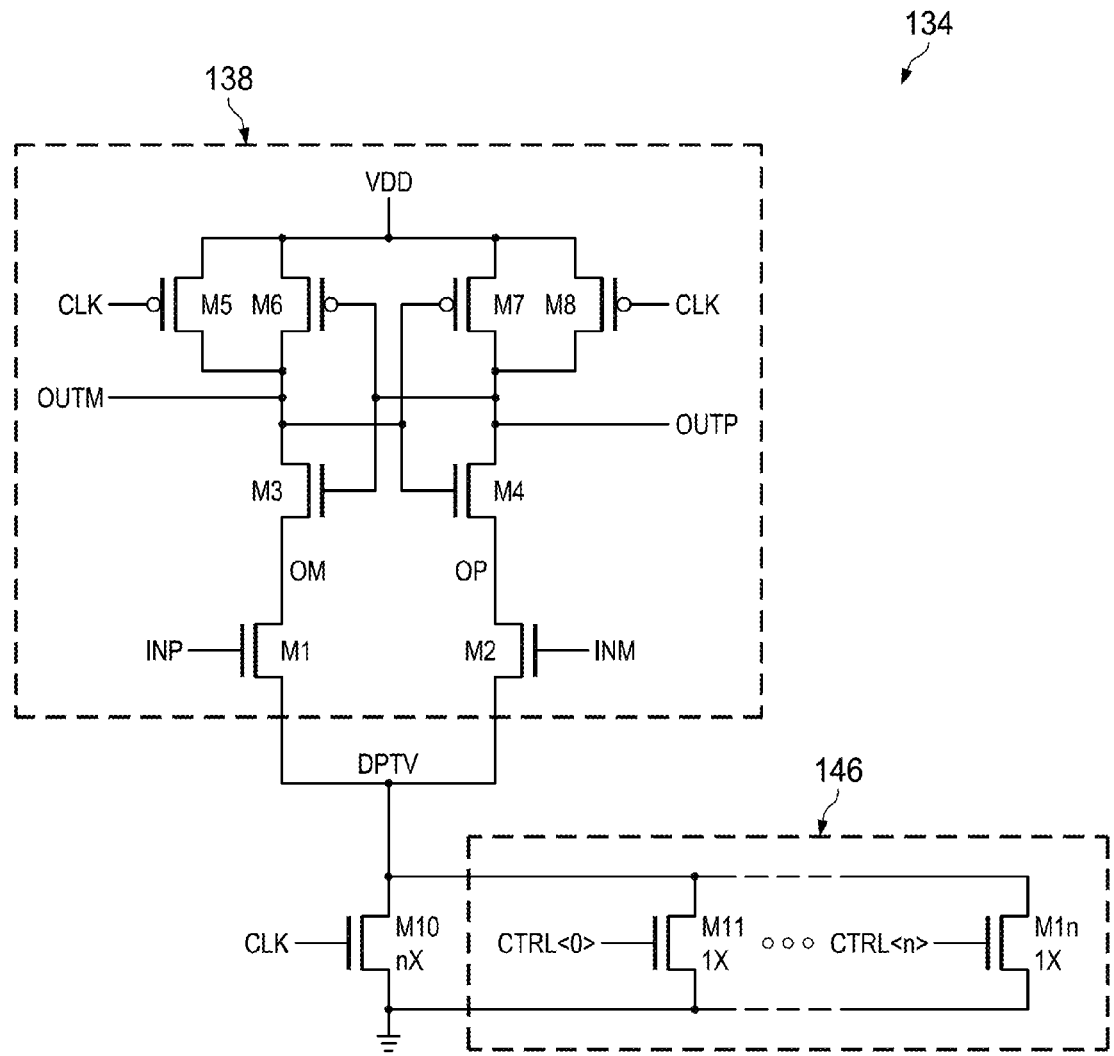
FIG. 3 illustrates a schematic diagram of a second implementation of the comparator shown in FIG. 1 in accordance with various embodiments of the present disclosure.

FIG. 3 illustrates a schematic diagram of a second implementation of the comparator shown in FIG. 1 in accordance with various embodiments of the present disclosure. The schematic diagram shown in FIG. 3 is similar to that shown in FIG. 2 except that the number of the transistors in the pre-charge apparatus 146 is equal to n, where n is an integer value greater than 2. Furthermore, a suitable control mechanism such as a thermometer control mechanism is applied to the pre-charge apparatus 146.

As shown in FIG. 3, the clock transistor M10 has nX transistor cells. The transistors (e.g., M11 and M1n) of the pre-charge apparatus 146 are formed by transistor cells similar to the transistor cells of the clock transistor M10. Each transistor of the pre-charge apparatus 146 has 1× transistor cells. The operation of the pre-charge apparatus 146 may be controlled by an n-bit thermometer code. As known in the art, a thermometer code employs a plurality of equally weighted elements. That is, each transistor controlled by a thermometer code is equal in size. For example, in order to achieve a thermometer code value of "2", the first two inputs (e.g., CTRL<0> and CTRL<1>) of the thermometer code are enabled. As a result, the first two transistors are turned on and connected in parallel with the clock transistor M10. The thermometer control mechanism is well known, and hence is not discussed in further detail herein.

Figure 4:
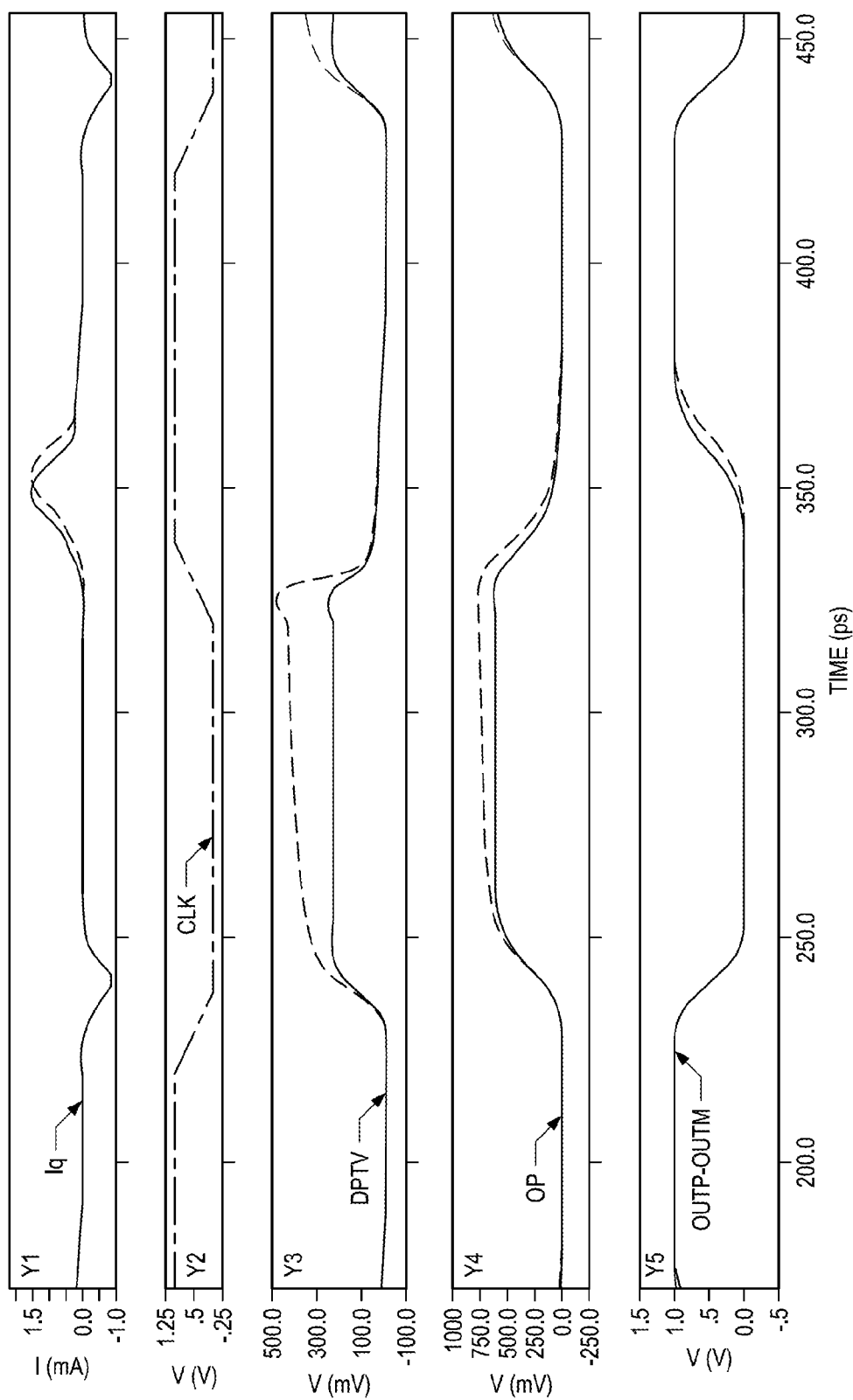
FIG. 4 illustrates timing diagrams showing signals associated with an example circuit corresponding to the embodiment shown in FIG. 2.

FIG. 4 illustrates timing diagrams showing signals associated with an example circuit corresponding to the embodiment shown in FIG. 2, in solid lines. The dashed lines represent the same signals in a conventional comparator without a pre-charge apparatus, and are shown for comparison purposes. The horizontal axis of FIG. 4 represents time. The first vertical axis Y1 represents the supply current flowing through the latch comparator 134. The supply current is the current flowing through the node DPTV. The second vertical axis Y2 represents the clock signal CLK. The third vertical axis Y3 represents the voltage at the node DPTV. The fourth vertical axis Y4 represents the voltage at the node OP. The fifth vertical axis Y5 represents the absolute voltage difference between the outputs OUTP and OUTM of the latch comparator 134.

As shown in FIG. 4, the supply current of the latch comparator with a pre-charge apparatus is comparable to the supply current of the latch comparator without a pre-charge apparatus. The increase of the supply current Iq resulting from using the pre-charge apparatus is less than 0.1 mA, which may be an acceptable level in some applications.

The clock signal CLK causes the circuitry to act in two operation phases. When the clock signal CLK has a logic low state, the latch comparator operates at a reset phase. Referring back to FIG. 2, when the clock signal CLK has a logic low state, both transistors M5 and M8 are turned on. As a result, both the outputs OUTM and OUTP are connected to VDD. In the reset phase, the output of the latch comparator is approximately equal to zero as shown in the waveform OUTP-OUTM of FIG. 4. On the other hand, when the clock signal CLK has a logic high state, the latch comparator operates at a comparison state.

The voltage at the node DPTV includes two waveforms. The solid line waveform represents the DPTV voltage of a latch comparator having a pre-charge apparatus. The dotted line waveform represents the DPTV voltage of a same latch comparator without having the pre-charge apparatus. As shown in FIG. 4, during a reset phase, the dotted line DPTV voltage (a comparator not having the pre-charge apparatus) is higher than the solid line DPTV voltage (a comparator having the pre-charge apparatus). The voltage difference shown in FIG. 4 is caused by using the pre-charge apparatus. More particularly, during the reset phase, the transistors of the pre-charge apparatus are selectively turned on through a control code. The turned-on transistors pull down the DPTV voltage as shown in FIG. 4.

One advantageous feature of having the solid line DPTV voltage shown in FIG. 4 is the lower DPTV voltage maintains the differential input stage (e.g., transistors M1 and M2 shown in FIG. 2) biased. As a result, the differential input stage responds quickly when the clock signal CLK changes from a reset phase (a logic low state) to a comparison phase (a logic high state). The quick response of the differential input stage may help to reduce the delay of the latch comparator.

The voltage at the node OP also includes two waveforms. The solid line waveform represents the OP voltage of a latch comparator having a pre-charge apparatus. The dotted line waveform represents the OP voltage of a same latch comparator without having the pre-charge apparatus. As shown in FIG. 4, during a reset phase, the dotted line OP voltage (a latch not having a pre-charge apparatus) is slightly higher than the solid line OP voltage (a latch having a pre-charge apparatus). The slight voltage difference shown in FIG. 4 is caused by using the pre-charge apparatus.

The output voltage of the latch comparator includes two waveforms. The solid line waveform represents the output voltage of the latch comparator having a pre-charge apparatus. The dotted line waveform represents the output voltage of the latch comparator without having the pre-charge apparatus. According to the operation principle of strongarm latch comparators, during the reset phase, the outputs OUTP and OUTM are pulled high to a level approximately equal to VDD. The total output (OUTP-OUTM) is approximately equal to zero. During the comparison phase, the clock signal CLK goes high. The input differential stage (e.g., transistors M1 and M2 shown in FIG. 2) compares the input signals INM and INP and generates a voltage difference at nodes OM and OP. The back-to-back connected inverters shown in FIG. 2 amplify the voltage difference and provide a full-swing output signal.

During a transition from a reset phase to a comparison phase, the output voltage response may be improved by using the latch comparator shown in FIG. 2. In some embodiments, in a latch comparator having a unit interval of 35.7 picoseconds, the latch comparator output voltage response time is reduced by 10 picoseconds by employing the latch comparator shown in FIG. 2.

In summary, one advantageous feature of having the pre-charge apparatus is the latch comparator may respond quickly when the clock signal CLK changes from the reset phase to the comparison phase. The quick response of the differential input stage may help to reduce the delay of the latch comparator.

Another advantageous feature of having the pre-charge apparatus is the pre-charge apparatus may help to reduce the input referred noise of a latch comparator. In some embodiments, by employing the pre-charge apparatus at a same latch comparator, the input referred noise is reduced by at least 50%.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A comparator comprising:
   a differential input stage comprising a first transistor and a second transistor, the first and second transistors configured to receive a differential input signal;
   an output stage coupled to the differential input stage, wherein the output stage is configured to amplify the differential input signal;
   a clock transistor connected between the differential input stage and a supply voltage; and
   a pre-charge apparatus connected in parallel with the clock transistor, wherein the pre-charge apparatus comprises a plurality of transistors connected in parallel and the pre-charge apparatus is configured to selectively bias the differential input stage by selectively turning on at least one transistor during a reset phase of the comparator.

2. The comparator of claim 1, wherein the pre-charge apparatus comprises:
   a first pre-charge transistor having a gate connected to a first control signal.

3. The comparator of claim 2, wherein the pre-charge apparatus further comprises:
   a second pre-charge transistor connected in parallel with the first pre-charge transistor, wherein a gate of the second pre-charge transistor is connected to a second control signal.

4. The comparator of claim 1, wherein:
   the first transistor and the second transistor are n-type transistors.

5. The comparator of claim 1, wherein:
the output stage comprises a first inverter and a second inverter, wherein the first inverter and the second inverter are back-to-back connected.

6. The comparator of claim 5, wherein:
the first inverter and the first transistor are connected in series between a bias voltage and the clock transistor; and
the second inverter and the second transistor are connected in series between the bias voltage and the clock transistor.

7. The comparator of claim 5, further comprising:
a first additional transistor coupled between a bias voltage and an output of the first inverter; and
a second additional transistor coupled between the bias voltage and an output of the second inverter.

8. The comparator of claim 7, wherein:
the differential input stage, the output stage, the clock transistor, the first additional transistor and the second additional transistor form a strong-arm latch comparator.

9. The comparator of claim 7, wherein:
a gate of the first additional transistor, a gate of the second additional transistor and a gate of the clock transistor are connected to a clock signal.

10. The comparator of claim 7, wherein:
an input of the first inverter is coupled to the output of the second inverter; and
the output of the first inverter is coupled to an input of the second inverter.

11. A system comprising:
a buffer configured to receive a differential signal and produce a buffered differential signal; and
a receiver connected to the buffer, the receiver having a latch comparator comprising:
a differential input stage configured to receive the buffered differential signal;
an output stage coupled to the differential input stage, wherein the output stage is configured to amplify the buffered differential signal;
a clock transistor connected between the differential input stage and a supply voltage; and
a pre-charge apparatus connected in parallel with the clock transistor, wherein the pre-charge apparatus comprises a plurality of transistors connected in parallel and the pre-charge apparatus is configured to selectively bias the differential input stage by selectively turning on at least one transistor during a reset phase of the latch comparator.

12. The system of claim 11, wherein:
the pre-charge apparatus comprises a transistor connected in parallel with the clock transistor.

13. The system of claim 11, wherein:
the differential input stage comprises a first transistor and a second transistor, and wherein a common node of the first transistor and the second transistor is connected to the clock transistor.

14. The system of claim 11, wherein:
the pre-charge apparatus comprises a plurality of transistors connected in parallel.

15. The system of claim 14, wherein:
each transistor of the pre-charge apparatus is controlled by one bit of an n-bit thermometer code.

16. A latch comparator comprising:
a differential input stage comprising a first transistor and a second transistor, the first and second transistors configured to receive a differential input signal;
an output stage coupled to the differential input stage, wherein the output stage is configured to amplify the differential input signal;
a clock transistor connected between the differential input stage and a supply voltage, wherein a gate of the clock transistor is configured to receive a clock signal; and
a pre-charge apparatus connected in parallel with the clock transistor, wherein the pre-charge apparatus comprises a plurality of transistors connected in parallel, and wherein at least one transistor of the plurality of transistors is configured to be turned on when the clock signal has a logic low state.

17. The latch comparator of claim 16, wherein:
each transistor of the pre-charge apparatus is controlled by one bit of an n-bit thermometer code.

18. The latch comparator of claim 17, wherein:
a transistor of the pre-charge apparatus is configured to be turned on when a corresponding bit of the n-bit thermometer code is at a logic high state.

19. The latch comparator of claim 17, wherein:
a transistor of the pre-charge apparatus is configured to be turned off when a corresponding bit of the n-bit thermometer code is at a logic low state.

20. The latch comparator of claim 16, wherein:
the differential input stage is selectively biased when the clock signal has the logic low state.

* * * * *